United States Patent
Wiesa et al.

(10) Patent No.: US 11,076,486 B2
(45) Date of Patent: Jul. 27, 2021

(54) ELECTRONIC UNIT AND METHOD FOR FORMING AN ELECTRONIC UNIT

(71) Applicant: Robert Bosch GmbH, Stuttgart (DE)

(72) Inventors: Thomas Wiesa, Vaihingen (DE); Stefan Doehren, Remshalden-Grunbach (DE); Udo Hennel, Sachsenheim (DE)

(73) Assignee: Robert Bosch GmbH, Stuttgart (DE)

(*) Notice: Subject to any disclaimer, the term of this patent is extended or adjusted under 35 U.S.C. 154(b) by 216 days.

(21) Appl. No.: 16/313,939

(22) PCT Filed: Jun. 1, 2017

(86) PCT No.: PCT/EP2017/063296
§ 371 (c)(1),
(2) Date: Dec. 28, 2018

(87) PCT Pub. No.: WO2018/001676
PCT Pub. Date: Jan. 4, 2018

(65) Prior Publication Data
US 2020/0296834 A1 Sep. 17, 2020

(30) Foreign Application Priority Data
Jun. 28, 2016 (DE) .................. 10 2016 211 637.1

(51) Int. Cl.
*H05K 3/28* (2006.01)
*H05K 1/18* (2006.01)
*H05K 1/14* (2006.01)

(52) U.S. Cl.
CPC ............ *H05K 1/181* (2013.01); *H05K 1/144* (2013.01); *H05K 3/284* (2013.01); *H05K 2201/042* (2013.01); *H05K 2201/10545* (2013.01)

(58) Field of Classification Search
CPC ........ H05K 1/181; H05K 1/144; H05K 3/284; H05K 2201/042; H05K 2201/10545; H05K 3/0034
(Continued)

(56) References Cited

U.S. PATENT DOCUMENTS 6,355,881 B1 * 3/2002 Braeges ................ H05K 3/284
174/521
2006/0012034 A1 * 1/2006 Kadoya .............. H05K 7/20872
257/712
(Continued)

FOREIGN PATENT DOCUMENTS

DE 1912635 9/1970
DE 4237870 3/1994
(Continued)

OTHER PUBLICATIONS

International Search Report for Application No. PCT/EP2017/063296 dated Oct. 16, 2017 (English Translation, 2 pages).

*Primary Examiner* — Sherman Ng
(74) *Attorney, Agent, or Firm* — Michael Best & Friedrich LLP

(57) ABSTRACT

The invention relates to an electronic unit (100, 100') comprising at least one printed circuit board (10, 10', 20) which is populated with a plurality of electric and/or electronic components (50, 50.1, 50.2) on one side or on both sides and which is incorporated into at least one protective housing (90) made of a solidified potting compound (80'). In the process, the electronic unit overall forms a volume body (200) in which the solidified potting compound takes up a filling volume (70). In order to minimize the filling volume, the electronic unit additionally comprises a separate insert molding part (60) which is arranged at least adjacently to a populated side of the at least one printed circuit board and which takes up a spatially closed displacement volume in the
(Continued)

volume body with respect to a flowable potting compound for forming the protective housing in a solidified state (80').

20 Claims, 2 Drawing Sheets

(58) Field of Classification Search
USPC .......................................................... 361/760
See application file for complete search history.

(56) References Cited

U.S. PATENT DOCUMENTS

| | | | | |
|---|---|---|---|---|
| 2008/0074829 A1* | 3/2008 | Kashiwazaki | ...... | H01L 23/4334 361/600 |
| 2008/0124987 A1* | 5/2008 | Chow | ................ | H01R 13/5202 439/736 |
| 2009/0086454 A1* | 4/2009 | Sakamoto | .............. | H05K 5/065 361/796 |
| 2012/0092842 A1* | 4/2012 | Neumeister | ......... | H01L 23/3135 361/761 |
| 2014/0183679 A1* | 7/2014 | Ehrenpfordt | .......... | H01L 25/167 257/433 |
| 2015/0062825 A1* | 3/2015 | Ossimitz | ............. | H01L 23/4006 361/719 |

FOREIGN PATENT DOCUMENTS

| | | |
|---|---|---|
| EP | 1643818 | 4/2006 |
| EP | 2265102 | 12/2010 |
| JP | H0310586 A | 1/1991 |
| WO | 2014128899 A1 | 8/2014 |
| WO | 2015188383 A1 | 12/2015 |

* cited by examiner

ELECTRONIC UNIT AND METHOD FOR FORMING AN ELECTRONIC UNIT

BACKGROUND OF THE INVENTION

The invention relates to an electronic unit and to a method for forming an electronic unit.

During operation, electronic units are exposed to many influences which cause interference or damage the electronics. Various protective devices are known which reduce or entirely prevent such influences. One simple possibility is provided by the electronic unit comprising a housing which internally receives a circuit-carrying printed circuit board to be protected. The housing is in this case generally configured in several parts, for example with a bottom part and a top part. In a mounting process, the printed circuit board is fastened inside the housing bottom. By means of closure elements located on the housing and optionally provided sealing elements, the printed circuit board may be protectively housed. In this case, electrical connection contacts need to be fed through the housing.

Published patent specification DE 1912 635 A1 discloses a high-voltage supply in which electrical components are mounted in a cup. Relatively large free cavities between the electrical components are filled with a multiplicity of loose and spatially randomly distributed ceramic balls. The remaining free space in the cup is filled by casting with an encapsulation compound made of silicone rubber. The encapsulation compound reduces the sparking distance of the electrical voltage and protects the embedded electronic components from moisture. A cover closes the cup at its free position. During the casting, the ceramic balls may occupy an undefined position in the cup and then be present in an inhomogeneous distribution.

Furthermore, published patent specification DE 4237 870 A1 describes a controller for a motor vehicle. In this case, a printed circuit board populated at least on one side with components is used as a carrier of the electronic circuit. The populated printed circuit board is enclosed by a highly electrically insulating encapsulation, applied with a contour fit, by a dip, spray or flocking process. In a further method, a shaped foam, by which the outer contour of the controller is determined, is additionally applied around the encapsulation.

SUMMARY OF THE INVENTION

The object of the invention is to propose effective protection of an electronic unit while minimizing individual parts and manufacturing processes.

The object is achieved by an electronic unit and by a method for forming an electronic unit.

The invention is based on an electronic unit comprising at least one printed circuit board which is populated on one or two sides with a multiplicity of electrical and/or electronic components. For protection against external influences—for example moisture, mechanical impact effects and/or short-circuit contacting—the populated printed circuit board is embedded at least in a protective housing made of a solidified encapsulation compound. For example, materials such as epoxides or polyurethanes are suitable as an encapsulation compound. The electronic unit is configured overall as a volume body. It is bounded by an outer shape configuration and application-specifically encloses a spatial volume of determined shape. A part of this enclosed volume is in this case occupied by the populated printed circuit board. Furthermore, the solidified encapsulation compound occupies a further part of the enclosed volume, in particular a remaining residual part, in the form of a filling volume. A maximum existing filling volume in this case depends on various factors. On the one hand, the electrical and/or electronic components arranged on the populated side of the printed circuit board may be arranged at different distances from one another. Furthermore, the electrical and/or electronic components arranged in this way may protrude or jut out to a different extent from the printed circuit board side. In particular, electrical and/or electronic components which are large and protrude over a long distance in turn determine the outermost edge regions of a possible volume body to be formed of the electronic unit. Ultimately, a maximum filling volume is then established by a simple shape configuration, established in the middle via the printed circuit board to be embedded, of the volume body to be determined. Application-specifically, a large filling quantity of encapsulation compound may therefore be necessary in order to form a protective housing. Furthermore, locally pronounced accumulations of encapsulation compound may in this case also be formed. In order to minimize the filling volume for the encapsulation compound, the electronic unit therefore additionally comprises a separate shaped insertion part. This is arranged at least adjacent to a populated side of the at least one printed circuit board. A minimization is in this case obtained in that the shaped insertion part occupies a spatially closed displacement volume in the volume body in relation to a flowable encapsulation compound for forming the protective housing in a solidified state. As a result, on the one hand the filling quantity of encapsulation compound in the volume body may therefore advantageously be established variably, in particular reduced to a minimum quantity, so that significant cost savings are obtained during production. By the shaped insertion part representing a spatially closed displacement volume, a defined and in particular constant arrangement relative to the printed circuit board is obtained even during a manufacturing process of the protective housing. In this way, the great advantage is obtained that the positions at which the encapsulation compound is intended to be present in the volume body can be established accurately. Optionally, these positions may be determined by a particularly advantageous configuration of the shaped insertion part, in such a way that manufacturing technology requirements for the formation of the protective housing by the encapsulation compound are optimally taken into account. Taking into account is, for example, ensuring stagnation-free flow paths for the flowable encapsulation compound during the production process. Likewise, sunk positions on the solidified encapsulation compound may be reduced or entirely avoided, for example by a permissible local accumulation inside the volume body, which accumulation is adapted to the solidification behavior of the encapsulation compound. Simple establishment of manufacturing technology requirements may be carried out from a computer-assisted encapsulation simulation in relation to the material used, or alternatively by prototype manufacture. Preferably, the shaped insert part is configured to be geometrically stable, particularly to an extent that general manufacturing tolerances in relation to the formation of the protective housing can be complied with.

There is a particular cost and manufacturing optimization when the displacement volume is at least as large as the filling volume, preferably more than two times as large.

The populated side of the at least one printed circuit board has a population topology which is characterized by the electrical and/or electronic components protruding from the populated side. In one preferred embodiment, a side of the shaped insertion part facing toward the populated side of the printed circuit board is adapted to the population topology. Particularly in the case of population topologies in which there are large height and/or distance dimension differences of the electrical and/or electronic components to one another, there are necessarily large spatial volumes between individual or several neighboring electrical and/or electronic components. By tracking the outer contour of the shaped insertion part in the direction of the population topology, a not inconsiderable part of the filling volume for the encapsulation compound can be application-specifically reduced. Adaptation to each individual electrical and/or electronic component is possible, but not in principle necessary as a whole. A pragmatic adaptation is in this case aimed at a suitable selection of a group of neighboring electrical and/or electronic components having a height and/or distance dimension within a value range. For example, an advantageous value range—starting from the electrical and/or electronic components with the smallest and/or greatest height dimension within the selected group—could be less than or equal to 5 mm, preferably less than or equal to 3 mm. The adaptation is then given locally by tracking the shaped insertion part as far as possible to the electrical and/or electronic component with the greatest component height within the selected group.

In principle, by such adaptation of the side of the shaped insertion part facing toward the populated side to the population topology, positionally correct arrangement of the shaped insertion part relative to the printed circuit board can be facilitated. Furthermore, shifting of such an arrangement is made difficult. A further improvement in this regard is obtained when the shaped insertion part comprises fixing regions. Such a fixing region may, for example, be in the form of an indentation inside the shaped insertion part, into which at least one electrical and/or electronic component then partially or almost fully penetrates and lateral movement of the shaped insertion part is therefore prevented. In the case of electrical and/or electronic components which are large and/or have a simple shape, for example electrolytic capacitors, the wall of the aforementioned indentation may bear on the electrical and/or electronic component and enclose it in a clamping fashion. As an alternative, a fixing region is formed merely as a locally protruding shaped element on the shaped insertion part, which element with at least one subregion laterally neighbors at least one electrical and/or electronic component and blocks possible movement in at least one direction by abutting directly against it. The protruding shaped element may additionally comprise a clamping region which laterally encloses the electrical and/or electronic component at least partially.

In one advantageous embodiment, a gap distance between the shaped insertion part and the adjacent populated side of the at least one printed circuit board is configured in such a way that the electrical and/or electronic components arranged on the populated side of the printed circuit board are fully enclosed by the encapsulation compound. Even in the case of a high population density of the printed circuit board, a stagnation-free flow path is thereby advantageously ensured for the encapsulation compound in the flowable state, so that all electrical and/or electronic components can be reached by the encapsulation compound. The gap distance may be obtained straightforwardly by the shaped insertion part comprising, for example, protruding bearing domes. By means of these, the shaped insertion part may bear between the electrical and/or electronic components through onto printed circuit board regions which are then component-free. As an alternative, a single bearing dome or a plurality thereof may respectively be braced on an electrical and/or electronic component.

A particularly great advantage is obtained in an embodiment in which, in a plan view of a populated side of the at least one printed circuit board, the shaped insertion part covers more than half of the printed circuit board, preferably in a coverage of from 70% to 100%. In this way, maximal reduction of the filling volume for the encapsulation compound can be achieved.

One particular embodiment of the electronic unit comprises two printed circuit boards populated on one or two sides and arranged above one another. Preferably, the shaped insertion part is then arranged between the two printed circuit boards. The volume space otherwise existing because of the separation of the printed circuit boards is per se poorly accessible for an encapsulation compound in terms of manufacturing technology, and can thereby easily be avoided. In addition, the shaped insertion part fulfills the function of a spacer for defined adjustment of a separation of the two printed circuit boards from one another.

A likewise advantageous embodiment is obtained when the at least one printed circuit board is populated on both sides, and a shaped insertion part is respectively arranged adjacent to the two populated sides of the printed circuit board. The reduction of a filling volume for the encapsulation compound is therefore not restricted only to a populated printed circuit board time, so that a very wide variety of embodiments of electronic units can profit. In principle, embodiments of electronic units may therefore be envisioned which comprise one or more printed circuit boards populated on one or both sides and in particular arranged above one another. In this case, if need be, for at least one up to all of the printed circuit boards provided, a shaped insertion part is respectively arranged adjacently on one and/or both populated sides of the respective printed circuit board.

Preferably, the shaped insertion part is formed in one piece. In this way, it is advantageously possible to very straightforwardly implement and ensure a spatially closed displacement volume for a flowable encapsulation compound. In this way, a very wide variety of shape configurations may be considered in terms of manufacturing technology. In principle, it is in this case advantageous that force actions, for example due to an encapsulation compound flowing around, take place in relation to a uniformly continuous shaped body. The behavior of the shaped insertion part when encapsulation compound is cast around it is therefore easy to predict, and the layout of the part can be established favorably in terms of geometrical stability. As an alternative, it is possible to provide the shaped insertion part as a continuous shaped part assembly. This comprises a group of body elements of the same type and/or different types, which form an assembly by a force, form and/or material fit. It corresponds in its behavior and its properties to the above-described one-piece shaped insertion part. The body elements may for example form very simple base bodies, which are cut to length from a favorable extrusion material and are connected to one another by means of their body element sides. By cutting to different lengths, the body elements in the assembly may then protrude to different extents in one direction and, for example, replicate an adaptation to a population topology of the at least one printed circuit board. On the body element sides, there may be connecting sections which, through at least two body elements arranged next to one another, are configured complementarily to one another. The connecting sections in this case form a snap connection, for example, so that the shaped part assembly is obtained by a force and/or form fit at the connecting sections. The complementary connecting sections may, as an alternative, also represent a slot and key system by which one body element engages with a key element into a groove element of a neighboring body element. In this case, longitudinal displacement along a rectilinearly directed extent axis of the key or groove element is made possible. The key element is then enclosed by the groove element at least in such a way that a form fit is formed and displacement of the body elements forming the shaped part assembly is no longer allowed except along the aforementioned extent axis. By the form fit additionally being configured in such a way that there is a slight clamping effect, displacement of the body element inside a shaped part assembly is sufficiently fixed against unintended relative displacement of individual body elements in the shaped state sufficiently for a mounting process.

According to one preferred embodiment, the shaped insertion part is a hollow shaped body or a shaped foam body. In both cases, the advantage is achieved that an electronic unit having only low weight can be obtained. By reducing the filling volume for the encapsulation compound, the latter is replaced with a much lighter-weight mass of the shaped insertion part.

In principle, it is a particular advantage that a defined shape configuration of the volume body may be implemented by means of the shaped insertion part. Such a shape configuration may for example be necessitated by functional technology, for example in order to adapt the electronic unit to a particular installation space and/or to assist handling. Likewise, a particular design vocabulary may be required for marketing purposes. A shape configuration may in principle be implemented with a great deal of latitude, even in such a way that there is a large spacing between the at least one contained printed circuit board populated on one or both sides and a body outer face of the electronic unit. This volume space thereby necessitated is very easy to fill with a corresponding space-occupying subregion of the shaped insertion part. In this way, an otherwise necessitated large filling volume for the encapsulation compound may advantageously be reduced as much as desired. A very simple shape configuration for the electronic unit is obtained when the volume body and/or the shaped insertion part is/are respectively configured as a polyhedron, that is to say all body outer faces are formed from planar face pieces. In this way, production of the electronic unit may be carried out economically in terms of costs and manufacturing, particularly in relation to a required tool, which is then very simple, for introducing the encapsulation compound in order to form a protective housing, on the one hand, as well as for the production of the shaped insertion part itself. In this context, shape configurations such as a cube, cuboid, tetrahedron, pyramid, pyramidal frustum or octahedron are particularly advantageous. Besides this, there are other simple shape configurations, for example a body of rotation, sphere, spherical cap, cylinder, ellipsoid, cone or conic frustum. Furthermore, it is possible to implement a volume body which is composed of at least two of the aforementioned shape configurations. Lastly, the volume body may comprise fully or at least partially curved body outer faces, although this may entail relatively great outlay on the tool side.

According to one advantageous embodiment, the volume body has at least one outer face part which is formed by a subregion of the shaped insertion part. Accordingly, it is no longer necessary for the electronic unit to be fully enclosed externally by a solidified encapsulation compound, so that a further saving can be achieved in terms of a filling quantity of encapsulation compound. Furthermore, the aforementioned subregion of the shaped insertion part may advantageously comprise in particular mechanical and/or electrical functional regions, which by implementation by an encapsulation compound are difficult to achieve, or can be achieved only with more outlay. Thus, the subregion of the shaped insertion part may comprise fastening elements as a way of fastening the electronic unit to a holder.

Essentially, the electronic unit comprises a connection region which allows the electrical contacting of the printed circuit board. Advantageously, the connection region is configured in the form of a connection jack, which is electrically contacted with the printed circuit board and can be contacted from outside the volume body by a mating jack. The connection region, or the connection jack, may in this case on the one hand emerge through a body outer face, formed by solidified encapsulation compound, of the volume body. On the other hand, it is possible to provide the connection region, or the connection jack, inside the aforementioned subregion, which forms at least one outer face region of the volume body, of the shaped insertion part.

In principle, a multiplicity of materials are possible for the shaped insertion part. The selection is dictated inter alia by a property of prime importance, for example a low weight, simple manufacturing possibilities, impact absorption capacity, low or very specific expansion behavior, etc. In order optionally to assist favorable heat dissipation of the electronic unit, the shaped insertion part may be made of metal. In this case, it is necessary to take care that short-circuit contacting in relation to the printed circuit board remains ruled out by a sufficient spacing. It may furthermore be ruled out by the encapsulation compound fulfilling the function of electrical insulation and encapsulating the populated printed circuit board. Another possibility is offered by the shaped insertion part being made of an electrically insulating material. Very economical shaped insertion parts may be manufactured using an elastomer material or a thermosetting material. Overall, manufacturing methods for producing the shaped insertion part which allow particularly economical manufacture in the scope of high unit number requirements are preferred. Depending on the material selected, for example an injection molding method, an extrusion blow molding method, a foaming method or a pressing method may be envisioned for this.

The invention also leads to a method for forming an electronic unit, in particular according to one of the embodiments described above, comprising at least one printed circuit board which is populated on one or two sides with a multiplicity of electrical and/or electronic components, having the method steps:

inserting the at least one printed circuit board together with a shaped insertion part into a tool that shapes a volume body of the electronic unit, the shaped insertion part being arranged adjacent to the at least one populated side, and a free space as a filling volume for an encapsulation compound remaining in the tool, introducing a flowable encapsulation compound into the tool until the filling volume is fully filled with encapsulation compound, forming a protective housing in which the printed circuit board is embedded, by the encapsulation compound being solidified and the solidified encapsulation compound forming at least a part of the outer face of the volume body.

BRIEF DESCRIPTION OF THE DRAWINGS

Further advantages, features and details of the invention may be found in the following description of preferred exemplary embodiments and with the aid of the drawing, in which.

DETAILED DESCRIPTION

Figure 1A:
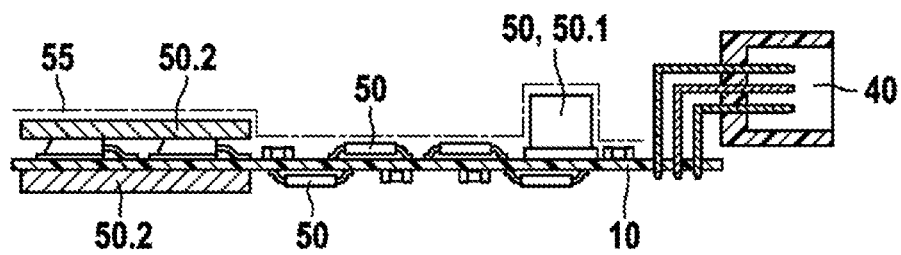
FIGS. 1a-1d show the formation of a first embodiment of an electronic unit at various times during manufacture.

In the figures, functionally equivalent components are respectively denoted by the same references.

FIGS. 1a-1d and FIGS. 2a-2d respectively show the formation of a first and a further embodiment of an electronic unit 100, 100' at various times during manufacture. In detail, FIGS. 1a and 2a respectively show the provision of a populated printed circuit board 10 and of an arrangement 5 of a printed circuit board 10' and a further printed circuit board 20 arranged parallel at a distance above the latter. In the present example, the two printed circuit boards 10', 20 are electrically connected to one another by means of flexible subregions 11, 21. Such printed circuit board embodiments are widely known, for example as Starflex or Semiflex embodiments and allow a flexible angle arrangement of the printed circuit boards 10', 20 with respect to one another. As an alternative, the arrangement 5 according to FIG. 2a additionally comprises a connection jack 40 contacted in a socket printed circuit board 30. This jack is, for example, part of the Starflex or Semiflex embodiment and respectively connected electrically to the printed circuit board 10' and the printed circuit board 20 by means of the flexible subregions 11, 21. The socket printed circuit board 30 is then for example oriented perpendicularly to the two printed circuit boards 10', 20, so that there is a way of connection in the direction of the extent of the two printed circuit boards 10', 20. As an alternative, the connection jack 40 could also be contacted directly with a circuit structure of the printed circuit board 10'—in particular by means of soldered pin contacts of the connection jack 40. Such contacting is shown in the embodiment according to FIG. 1a. In principle, the printed circuit boards 10, 10', 20 may respectively be a printed circuit board populated on one or both sides. A multiplicity of electrical and/or electronic components 50, 50.1, 50.2 are arranged on the then populated printed circuit board side, and together with a conducting track structure form an electrical circuit. In the present exemplary embodiments, the electrical circuit additionally comprises heat sinks 50.2, which are contacted in a respective power region of the printed circuit board 10, 10', for example by means of solder spacer bumps. Many of the electrical and/or electronic components 50.1, for example capacitors, protrude more greatly from the populated printed circuit board side in comparison with others. Because of the different protrusion of the electrical and/or electronic components 50, 50.1, 50.2, a population topology 55 of the populated printed circuit board side is formed overall (for simplicity, no longer shown in FIGS. 1b-1d and in FIGS. 2b-2d).

Figure 1B:
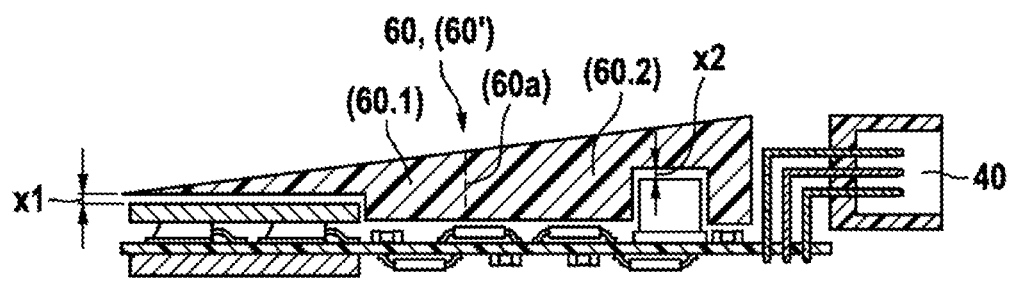
Figure 2A:
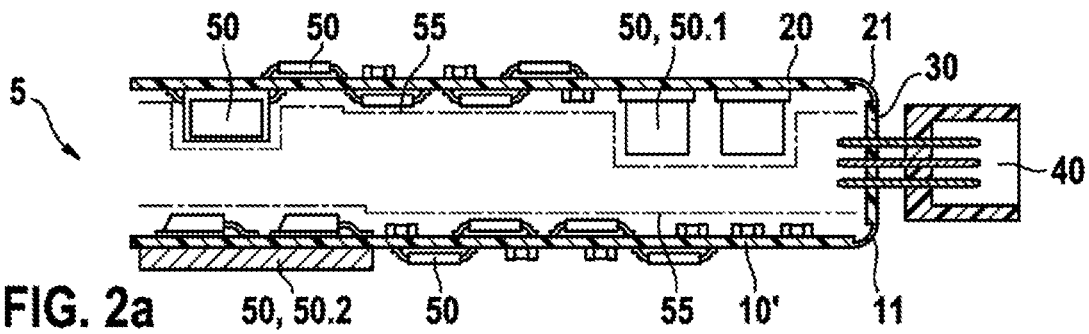
FIGS. 2a-2d show the formation of a further embodiment of an electronic unit at various times during manufacture.
Figure 2B:
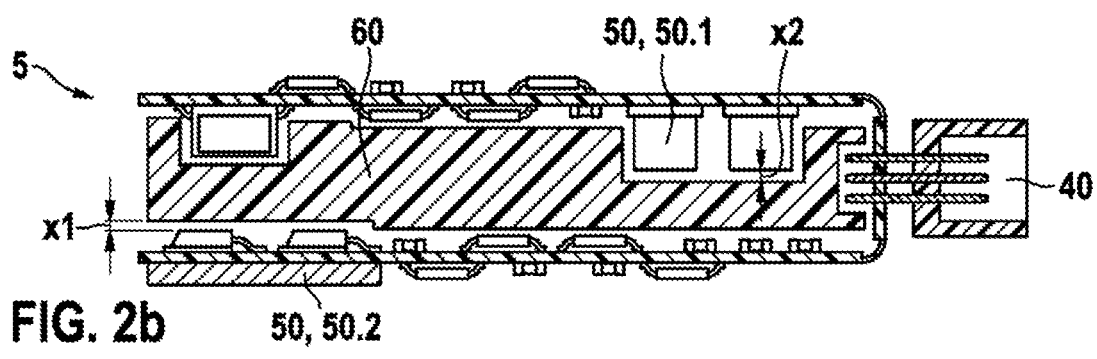

FIGS. 1b and 2b respectively show a further method step for the formation of the corresponding embodiment of the electronic unit 100, 100'. Essentially, a shaped insertion part 60 is in this case arranged adjacent to at least one populated printed circuit board side. This part may preferably be formed as an injection molded part, a hollow shaped body or a shaped foam body. Preferably, the shaped insertion part 60 is provided from an in particular electrically insulating plastic material. Further preferably, the shaped insertion part 60 is formed in one piece. As an alternative, such a shaped insertion part 60 may also be in the form of a shaped part assembly 60' comprising a body element 60.1 and a body element 60.2—as indicated only schematically in FIG. 1b. The two body elements 60.1, 60.2 are rigidly connected to one another by means of a form, force or material fit using connection sections 60a respectively formed on the body element sides.

A side, facing toward the populated printed circuit board side, of the shaped insertion part 60 is adapted to the population topology 55 existing there. Furthermore, a gap distance x1, x2 is preferably provided between the electrical and/or electronic components 50, 50.1, 50.2. With reference to the embodiment represented in FIG. 2b, the shaped insertion part 60 is adapted in relation to the population topology 55 respectively of a populated side of the printed circuit boards 10', 20, 30. In this case, the shaped insertion part 60 is inserted between the printed circuit boards 10', 20. The shaped insertion part 60 according to FIG. 1a is configured in the shape of a wedge and adapted on its base face to the population topology of the printed circuit board 10. In general, by the adaptations to the population topology, the shaped insertion part 60 is prevented from impacting on electrical and/or electronic components 50, 50.1, 50.2 at least in its possibility of lateral movement. Preferably, such a shaped insertion part has a shape configuration of simple bodies.

Figure 1C:
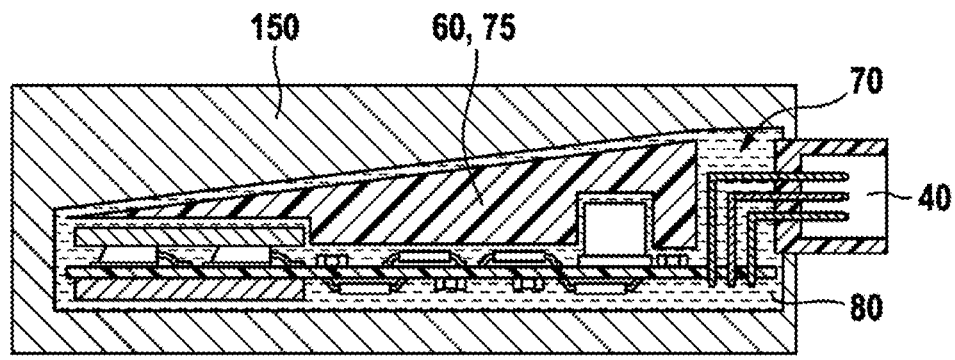
Figure 2C:
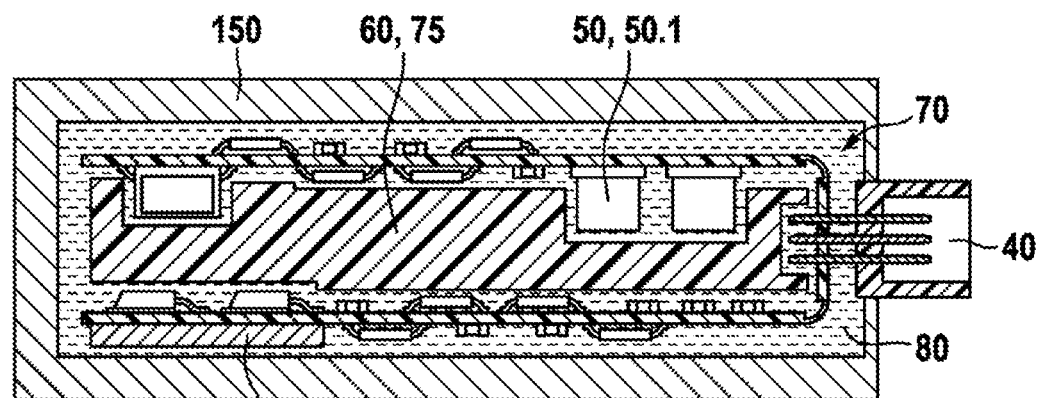

FIGS. 1c and 2c respectively show a next method step, which provides insertion of the at least one printed circuit board 10, or of the arrangement 5 comprising the printed circuit boards 10', 20, 30, together with the corresponding shaped insertion part 60 into a tool 150 which shapes a volume body 200 of the electronic unit 100, 100'. In this case, a free space as a filling volume 70 for an encapsulation compound 80 remains between the wall of the tool 150. The encapsulation compound 80 is introduced into the free space in a flowable state through a filling opening (not represented) of the tool 150. In this case, the shaped insertion part 60 occupies a spatially closed displacement volume 75 in the volume body 200 in relation to the encapsulation compound 80 flowing in. The encapsulation compound 80 is therefore forced to flow around the shaped insertion part 60 until the filling volume 70 is completely filled with the encapsulation compound 80. By the encapsulation compound 80' solidifying, a protective housing 90 is formed in which the printed circuit board 10, or the arrangement 5 of the printed circuit boards 10', 20, 30, is embedded.

Figure 1D:
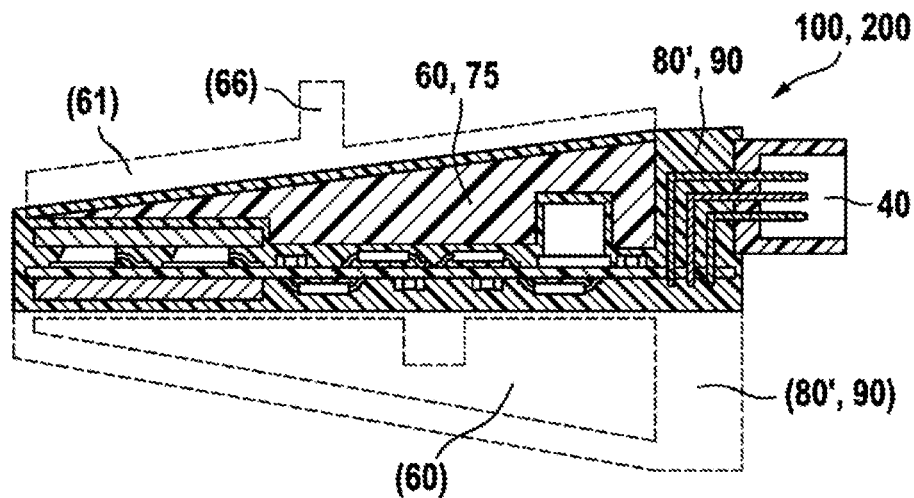
Figure 2D:
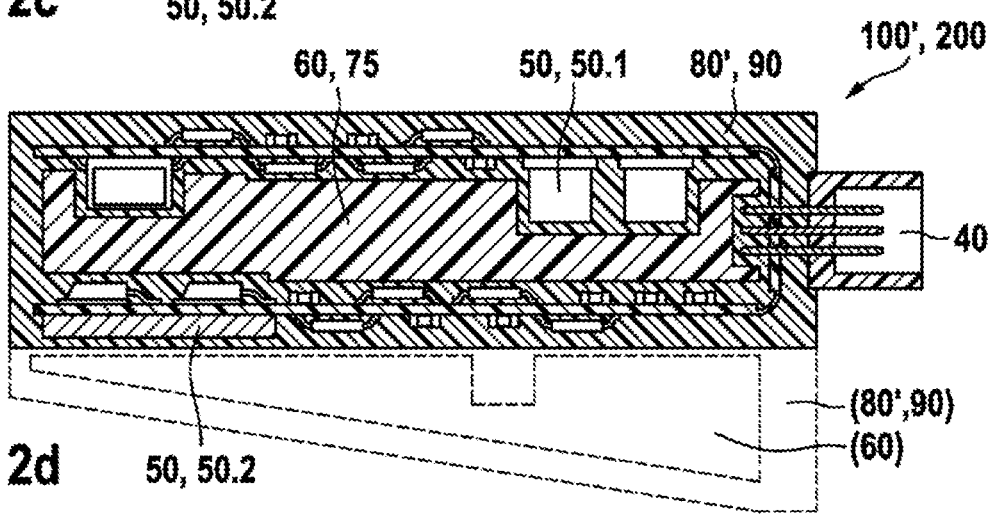

FIGS. 1d and 2d show the first and the further embodiment of the electronic unit 100, 100' in a state released from the tool 150. In this case, the solidified encapsulation compound 80' forms the outer face of the respective volume body 200. The connection contact 40 emerges from one of these outer faces and offers a possibility for electrical contacting of the electronic unit 100, 100', for example in the form of a controller having a corresponding mating jack.

Furthermore, other embodiments of an electronic unit are indicated and, for simplicity, only represented by dashes in FIGS. 1d and 2d. One alternative embodiment is obtained, for example, by a shaped insertion part 60 respectively being arranged adjacently on both populated sides of the printed circuit board 10, 10'. This is, for example, necessary because strongly protruding electrical components 50.1 also jut out on the second populated printed circuit board side or a very particular shape configuration of the electronic unit 100, 100' is to be implemented. In addition to or independently thereof, an embodiment of the electronic unit 100 may be envisioned in which the volume body 200 comprises at least one outer face part which is formed by a subregion 61 of the shaped insertion part 60, as schematically indicated in FIG. 1d. The subregion 61 of the shaped insertion part 60 comprises, for example, fastening elements 66 as a possibility for fastening the electronic unit 100 to a holder (not represented).

The invention claimed is:

1. An electronic unit (100, 100') comprising at least one printed circuit board (10, 10', 20) which is populated on one or two sides with a multiplicity of electrical and/or electronic components (50, 50.1, 50.2) and is embedded at least in a protective housing (90) made of a solidified encapsulation compound (80'), the electronic unit (100, 100') overall forming a volume body (200) in which the solidified encapsulation compound (80') occupies a filling volume (70), characterized in that in order to minimize the filling volume (70), the electronic unit (100, 100') additionally comprises a separate shaped insertion part (60) which is arranged at least adjacent to a populated side of the at least one printed circuit board (10, 10', 20) and occupies a spatially closed displacement volume in the volume body (200) in relation to a flowable encapsulation compound (80) for forming the protective housing (90) in a solidified state (80'), and wherein the shaped insertion part (60) is not electrically connected to (i) the at least one printed circuit board (10, 10', 20) and (ii) electrical and/or electronic components on the circuit board, and is completely encapsulated within the solidified encapsulation compound (80'), and wherein the displacement volume is at least as large as the filling volume (70).

2. The electronic unit (100, 100') as claimed in claim 1, characterized in that the populated side of the at least one printed circuit board (10, 10', 20) has a population topology (55) which is characterized by the electrical and/or electronic components (50, 50.1, 50.2) protruding from the populated side, a side of the shaped insertion part (60) facing toward the populated side being adapted to the population topology (55).

3. The electronic unit (100, 100') as claimed in claim 1, characterized in that a gap distance (x1, x2) between the shaped insertion part (60) and the adjacent populated side of the at least one printed circuit board (10, 10', 20) is configured in such a way that the electrical and/or electronic components (50, 50.1, 50.2) arranged on the populated side of the printed circuit board (10, 10', 20) are fully enclosed by the encapsulation compound (80').

4. The electronic unit (100, 100') as claimed in claim 1, characterized in that in a plan view of the populated side of the at least one printed circuit board (10, 10', 20), the shaped insertion part (60) covers more than half of the printed circuit board (10, 10', 20).

5. The electronic unit (100, 100') as claimed in claim 1, characterized in that the electronic unit (100, 100') comprises two printed circuit boards (10', 20) populated on one or two sides and arranged above one another, the shaped insertion part (60) being arranged between the two printed circuit boards (10', 20).

6. The electronic unit (100, 100') as claimed in claim 1, characterized in that the at least one printed circuit board (10, 10', 20) is populated on both sides, and a second shaped insertion part (60) is arranged adjacent to a second one of the two populated sides of the printed circuit board (10, 10', 20).

7. The electronic unit (100, 100') as claimed in claim 1, characterized in that the shaped insertion part (60) is formed in one piece or made of a continuous shaped part assembly (60').

8. The electronic unit (100, 100') as claimed in claim 1, characterized in that the shaped insertion part (60) is a hollow shaped body or a shaped foam body.

9. The electronic unit (100, 100') as claimed in claim 1, characterized in that the shaped insertion part (60) is made of an electrically insulating material.

10. The electronic unit (100, 100') as claimed in claim 1, characterized in that the volume body (200) and/or the shaped insertion part (60) is/are respectively formed as a polyhedron, or as a body of rotation or sphere or spherical cap or cylinder or ellipsoid or cone or conic frustum.

11. The electronic unit (100, 100') as claimed in claim 1, characterized in that the volume body (200) has at least one outer face part which is formed by a subregion (61) of the shaped insertion part (60).

12. The electronic unit (100, 100') as claimed in claim 11, characterized in that the subregion (61) of the shaped insertion part (60) comprises fastening elements (66) as a way of fastening the electronic unit (100, 100') to a holder.

13. The electronic unit (100, 100') as claimed in claim 1, characterized in that the electronic unit (100, 100') comprises a connection jack (40), which is electrically contacted with the printed circuit board (10, 30) and can be contacted from outside the volume body (200) by a mating jack (40).

14. A method for forming an electronic unit (100, 100'), as claimed in claim 1, comprising at least one printed circuit board (10, 10', 20) which is populated on one or two sides with a multiplicity of electrical and/or electronic components (50, 50.1, 50.2), having the method steps:

inserting the at least one printed circuit board (10, 10', 20) together with a shaped insertion part (60) into a tool (150) that shapes a volume body (200) of the electronic unit (100, 100'), the shaped insertion part (60) being arranged adjacent to the at least one populated side, and a free space as a filling volume (70) for an encapsulation compound (80) remaining in the tool (150), introducing a flowable encapsulation compound (80) into the tool until the filling volume (70) is fully filled with encapsulation compound (80), and forming a protective housing (90) in which the printed circuit board (10, 10', 20) is embedded, by the encapsulation compound (80') being solidified and the solidified encapsulation compound (80') forming at least a part of the outer face of the volume body (200).

15. The electronic unit (100, 100') as claimed in claim 1, characterized in that the displacement volume is more than two times as large as the filling volume (70).

16. The electronic unit (100, 100') as claimed in claim 1, characterized in that in a plan view of the populated side of the at least one printed circuit board (10, 10', 20), the shaped insertion part (60) covers from 70% to 100% of the printed circuit board (10, 10', 20).

17. The electronic unit (100, 100') as claimed in claim 1, characterized in that the volume body (200) and/or the shaped insertion part (60) is/are respectively formed as a cube, cuboid, tetrahedron, pyramid, pyramidal frustum, or octahedron, or as a body of rotation or sphere or spherical cap or cylinder or ellipsoid or cone or conic frustum.

18. The electronic unit (100, 100') as claimed in claim 1, characterized in that the shaped insertion part (60) does not contact (i) the at least one printed circuit board (10, 10', 20) and (ii) the multiplicity of electrical and/or electronic components (50, 50.1, 50.2) on the at least one printed circuit board (10, 10', 20).

19. A method for forming an electronic unit (100, 100') comprising at least one printed circuit board (10, 10', 20) which is populated on one or two sides with a multiplicity of electrical and/or electronic components (50, 50.1, 50.2), having the method steps:

inserting the at least one printed circuit board (10, 10', 20) together with a shaped insertion part (60) into a tool (150) that shapes a volume body (200) of the electronic unit (100, 100'), the shaped insertion part (60) being arranged adjacent to the at least one populated side, and a free space as a filling volume (70) for an encapsulation compound (80) remaining in the tool (150), introducing a flowable encapsulation compound (80) into the tool until the filling volume (70) is fully filled with encapsulation compound (80) such that the encapsulation compound (80) completely surrounds the shaped insertion part (60), and forming a protective housing (90) in which the printed circuit board (10, 10', 20) is embedded, by the encapsulation compound (80') being solidified and the solidified encapsulation compound (80') forming at least a part of the outer face of the volume body (200), and wherein the insertion part (60) is not electrically connected to (i) the at least one printed circuit board (10, 10', 20) and (ii) electrical and/or electronic components on the circuit board, and wherein the displacement volume is at least as large as the filling volume (70).

20. The method as claimed in claim 19, characterized in that the shaped insertion part (60) does not contact (i) the at least one printed circuit board (10, 10', 20) and (ii) the multiplicity of electrical and/or electronic components (50, 50.1, 50.2) on the at least one printed circuit board (10, 10', 20).

* * * * *